(12) United States Patent
So et al.

(10) Patent No.: US 9,287,338 B2
(45) Date of Patent: Mar. 15, 2016

(54) PORTABLE ELECTRONIC APPARATUS

(71) Applicant: Samsung Display Co., Ltd., Yongin, Gyeonggi-Do (KR)

(72) Inventors: Dongyoon So, Yongin (KR); Taegon Kim, Yongin (KR); Jiyong Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/571,814

(22) Filed: Dec. 16, 2014

(65) Prior Publication Data

US 2015/0380473 A1 Dec. 31, 2015

(30) Foreign Application Priority Data

Jun. 30, 2014 (KR) .................. 10-2014-0081212

(51) Int. Cl.
*H01L 27/32* (2006.01)
*H01L 51/52* (2006.01)

(52) U.S. Cl.
CPC ........ *H01L 27/3246* (2013.01); *H01L 27/3225* (2013.01); *H01L 51/5237* (2013.01)

(58) Field of Classification Search
None
See application file for complete search history.

(56) References Cited

U.S. PATENT DOCUMENTS

| | | | |
|---|---|---|---|
| 6,380,672 B1* | 4/2002 | Yudasaka | H01L 27/3246 313/504 |
| 7,852,448 B2 | 12/2010 | Shirasaka et al. | |
| 8,018,141 B2 | 9/2011 | Kim | |
| 8,445,923 B2* | 5/2013 | Lee | H01L 51/525 257/88 |
| 8,536,785 B2 | 9/2013 | Choi et al. | |
| 8,569,947 B2* | 10/2013 | Jeon | H01L 27/3211 313/500 |
| 2002/0158835 A1* | 10/2002 | Kobayashi | H01L 27/3244 345/100 |
| 2002/0180371 A1* | 12/2002 | Yamazaki | H01L 27/3246 315/169.3 |
| 2005/0023969 A1* | 2/2005 | Omata | H01L 27/3246 313/504 |
| 2008/0063949 A1* | 3/2008 | Inoue | H01L 27/3246 430/5 |
| 2010/0171416 A1* | 7/2010 | Lee | H01L 51/525 315/504 |
| 2013/0021566 A1 | 1/2013 | Akitomo et al. | |

FOREIGN PATENT DOCUMENTS

| | | |
|---|---|---|
| JP | 2006-091504 A | 4/2006 |
| JP | 2007-328129 A | 12/2007 |
| KR | 10-2007-0052151 A | 5/2007 |
| KR | 10-0889682 B1 | 3/2009 |
| KR | 10-2013-0002344 A | 1/2013 |
| KR | 10-2013-0045488 A | 5/2013 |

* cited by examiner

*Primary Examiner* — Andres Munoz
(74) *Attorney, Agent, or Firm* — Knobbe Martens Olson & Bear LLP

(57) ABSTRACT

A portable electronic apparatus comprises a substrate comprising a first surface and a second surface; a plurality of pixel electrodes arranged over the first surface of the substrate; a pixel-defining layer arranged over the first surface of the substrate such that at least a portion of each of the plurality of pixel electrodes is exposed; a plurality of protrusions formed over the pixel-defining layer; and an electronic component arranged over the second surface of the substrate and attached to the substrate, the electronic component having a polygonal shaped surface facing and substantially parallel to the second surface of the substrate. When viewed in a direction perpendicular to the second surface, imaginary straight lines that pass the plurality of protrusions are substantially parallel to at least one among sides of the polygonal shaped surface and do not pass the exposed portions of the plurality of pixel electrodes.

16 Claims, 4 Drawing Sheets

PORTABLE ELECTRONIC APPARATUS

RELATED APPLICATION

This application claims the benefit of Korean Patent Application No. 10-2014-0081212, filed on Jun. 30, 2014, in the Korean Intellectual Property Office, the disclosure of which is incorporated herein in its entirety by reference.

BACKGROUND

1. Field

The present disclosure relates to a portable electronic apparatus minimizing or avoiding the occurrence of defects in a display.

2. Description of the Related Art

In general, a portable electronic apparatus includes a display unit to provide a user with various pieces of information such as images or videos, information about a state or operation of the portable electronic apparatus, a user interface used to easily manipulate the portable electronic apparatus, or the like. Recently, a portable electronic apparatus, which has an organic light-emitting display, which uses emission devices as pixels, as a display unit of the portable electronic apparatus has been developed. In particular, the organic light-emitting display has good viewing angles and may display clear images so that the organic light-emitting display has been greatly used in the portable electronic apparatus.

SUMMARY

An aspect of the invention provides a portable electronic apparatus comprising: a substrate comprising a first surface and a second surface facing away from the first surface; a plurality of pixel electrodes arranged over the first surface of the substrate; a pixel-defining layer arranged over the first surface of the substrate such that at least a portion of each of the plurality of pixel electrodes is exposed; a plurality of protrusions formed over the pixel-defining layer; and an electronic component arranged over the second surface of the substrate and attached to the substrate, the electronic component having a polygonal shaped surface facing and substantially parallel to the second surface of the substrate, wherein, when viewed in a direction perpendicular to the second surface, imaginary straight lines that pass the plurality of protrusions are substantially parallel to at least one among sides of the polygonal shaped surface and do not pass the exposed portions of the plurality of pixel electrodes.

In the foregoing apparatus, the polygonal shaped surface may have a rectangular shape or a square shape. The electronic component may be a battery or a printed circuit board (PCB). The pixel-defining layer and the plurality of protrusions may be integrally formed in a single body. The sides of the polygonal shaped surface may be substantially parallel to edges of the substrate when viewed in the direction.

Still in the foregoing apparatus, each of the exposed portions of the plurality of pixel electrodes may be surrounded by the pixel defining layer when viewed in the direction and has a major axis and a minor axis, and wherein the major and minor axes are substantially parallel to the sides of the polygonal shaped surface when viewed in the direction. The sides of the polygonal shaped surface may cross edges of the substrate when viewed in the direction. Each of the exposed portions of the plurality of pixel electrodes may have a major axis and a minor axis, and the major and minor axes cross the sides of the polygonal shaped surface when viewed in the direction. The plurality of protrusions may be disposed between the plurality of pixel electrodes in the major axis direction and the minor axis direction when viewed in the direction.

Yet in the foregoing apparatus, the exposed portions of the plurality of pixel electrodes do not overlap the protrusions when viewed in the direction. The electronic component may be more rigid that the substrate. The polygonal shaped surface may be bonded directly on the second surface of the substrate using an adhesive. The imaginary straight lines may be inclined with respect to edges of the substrate when viewed in the direction.

Further in the foregoing apparatus, the portable electronic apparatus may further comprise a cover plate disposed over the substrate, wherein the plurality of pixel electrodes, the pixel defining layer and the protrusions are disposed between the substrate and the cover plate. The cover plate may be spaced from and does not contact the protrusion when external force is not applied. The electronic component may be more rigid than the substrate and the cover plate.

Another aspect of the invention provides a method of handling a portable electronic apparatus, the method comprising: providing the foregoing portable electronic apparatus; applying external force to bend the portable electronic apparatus such that the substrate and the cover plate are deformed and further such that at least one among the plurality of protrusions touches the cover panel and leaves at least one mark on the cover panel; and releasing the external force from the portable electronic apparatus, wherein, after releasing the external force, the at least one mark on the cover panel does not overlap the exposed portions of the plurality of pixel electrodes when viewed in the direction.

In the foregoing method, the portable electronic apparatus may further comprise an additional layer disposed between the substrate and the cover plate, wherein a portion of the additional layer touches the cover plate when bending the portable electronic apparatus. The protrusion may comprise the touching portion of the additional layer. When the portable electronic device is bend, the substrate may be bent to have a curvature greater than that of the cover plate at a location in the proximity of the at least one of the sides of the electronic component such that the at least one among the plurality of protrusions touches the cover panel.

One or more embodiments of the present invention include a portable electronic apparatus that may solve problems including the above-described problem and may prevent the occurrence of defects in the display unit.

Additional aspects will be set forth in part in the description which follows and, in part, will be apparent from the description, or may be learned by practice of the presented embodiments.

According to one or more embodiments of the present invention, a portable electronic apparatus includes: a substrate; a plurality of pixel electrodes arranged on one side of the substrate; a pixel-defining layer arranged on the one side of the substrate in order to expose at least a center of each of the plurality of pixel electrodes; a plurality of spacers disposed on the pixel-defining layer; and an electronic component arranged the other side of the substrate and having a surface parallel to the substrate, wherein the surface parallel to the substrate has a polygonal shape, wherein straight lines that pass the plurality of spacers and are parallel to sides of the surface that have the polygonal shape do not pass portions of the plurality of pixel electrodes, the portions of the plurality of pixel electrodes being exposed by the pixel-defining layer.

The polygonal shape may be a rectangular shape or a square shape.

The electronic component may be a battery or a printed circuit board (PCB).

The pixel-defining layer and the plurality of spacers may be integrally formed in a single body.

The sides that have the polygonal shape may be parallel to edges of the substrate.

Each of the portions of the plurality of pixel electrodes exposed by the pixel-defining layer may have a major axis and a minor axis, and the major and minor axes may be parallel to the sides that have the polygonal shape.

The sides that have the polygonal shape may cross edges of the substrate.

Each of the portions of the plurality of pixel electrodes exposed by the pixel-defining layer may have a major axis and a minor axis, and the major and minor axes may cross the sides that have the polygonal shape.

The plurality of spacers may be disposed between the plurality of pixel electrodes in the major axis direction and the minor axis direction.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
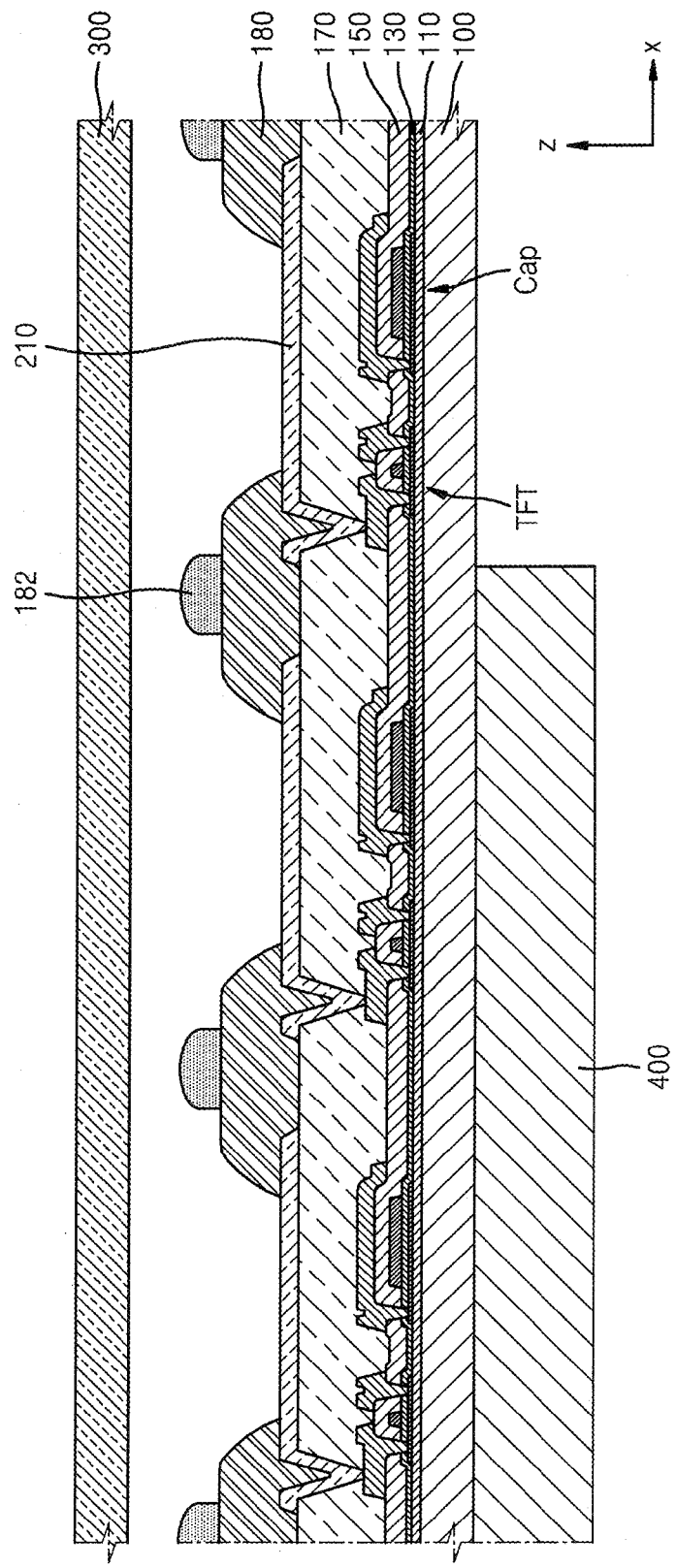
FIG. 1 is a cross-sectional view of a portion of a portable electronic apparatus according to an embodiment of the present invention.

As the invention allows for various changes and numerous embodiments, particular embodiments will be illustrated in the drawings and described in detail in the written description. The attached drawings for illustrating embodiments of the present invention are referred to in order to gain a sufficient understanding of the present invention, the merits thereof, and the objectives accomplished by the implementation of the present invention. This invention may, however, be embodied in many different forms.

Hereinafter, the present invention will be described in detail by explaining embodiments of the invention with reference to the attached drawings. Like reference numerals in the drawings denote like elements, and repeated descriptions thereof will be omitted.

It will be understood that when a component, such as a layer, a film, a region, or a plate, is referred to as being "on" another component, the component can be directly on the other component or intervening components may be present thereon. Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In a display unit of a portable electronic apparatus having an organic light-emitting display may have defects while manufacturing or using the conventional portable electronic apparatus. Embodiments of the present invention provide a configuration to avoid or minimize such defects.

Figure 2:
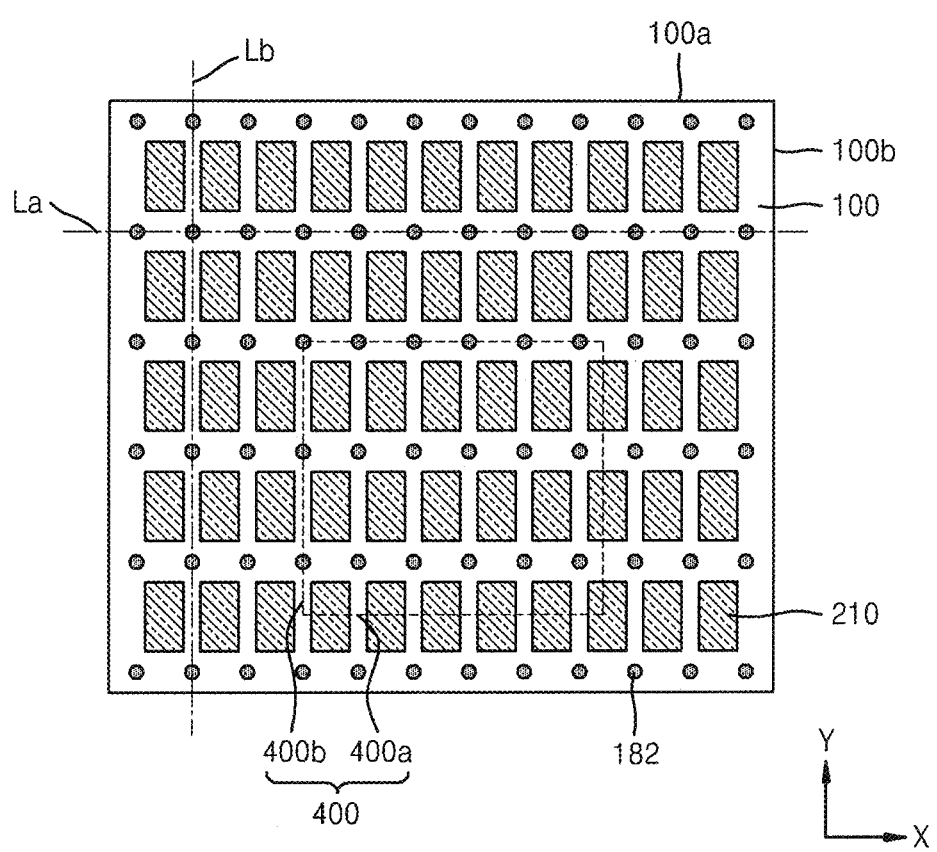
FIG. 2 is a plan view of a portion of the portable electronic apparatus of FIG. 1 according to an embodiment of the present invention.

FIG. 1 is a cross-sectional view of a portion of a portable electronic apparatus according to an embodiment of the present invention, and FIG. 2 is a plan view of a portion of the portable electronic apparatus of FIG. 1 according to an embodiment of the present invention. The portable electronic apparatus according to one or more embodiments of the present invention includes a display unit and an electronic component 400.

The display unit may be an organic light-emitting display, as shown in FIG. 1. FIG. 1 shows a portion of the organic light-emitting display. In particular, FIG. 1 shows that the organic light-emitting display includes a substrate 100, pixel electrodes 210 arranged on a surface of the substrate 100 in a positive Z direction, and a pixel-defining layer 180 that is arranged on a surface of the substrate 100 in a positive Z direction, includes centers of the pixel electrodes 210 and exposes at least a portion of the pixel electrodes 210. In the illustrated embodiment, the pixel-defining layer 180 may protrude more than the pixel electrodes 210 in a positive Z direction, with respect to the substrate 100. Spacers 182 are arranged on the pixel-defining layer 180. An opposite substrate or cover plate 300 is arranged on the pixel electrodes 210, the pixel-defining layer 180, and the spacers 182, and thus, the pixel electrodes 210, the pixel-defining layer 180, and the spacers 182 are arranged between the substrate 100 and the opposite substrate 300.

The substrate 100 or the opposite substrate 300 may be formed of various materials such as glass materials, metals, plastics such as polyethylene terephthalate (PET), polyethylene naphthalate (PEN), and polyimide, or the like.

The pixel electrodes 210 may be a transparent (translucent) electrode or a reflective electrode. When the pixel electrodes 210 are a transparent (translucent) electrode, the pixel electrodes 210 may be formed of indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210 are a reflective electrode, the pixel electrodes 210 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or combinations thereof, and a film formed of ITO, IZO, ZnO, or $In_2O_3$. However, structures or materials of the pixel electrodes 210 are not limited thereto and may vary.

Since the pixel-defining layer 180 has openings corresponding to sub-pixels, that is, openings that expose centers of the pixel electrodes 210 or an entire portion of each of the pixel electrodes 210, the pixel-defining layer 180 may define pixels which may form an array. Also, the pixel-defining layer 180 increases a distance between end portions of the pixel electrodes 210 and opposite electrode disposed above the pixel electrodes 210, and thus, the pixel-defining layer 180 may prevent arcs or other defects from occurring at the end portions of the pixel electrodes 210. The pixel-defining layer 180 may be formed of various materials, for example, an organic material such as acryl or polyimide, or an inorganic material such as silicon oxide or silicon nitride. The spacers 182 arranged on the pixel-defining layer 180 may also be formed of various materials, for example, an organic material such as acryl or polyimide, or an inorganic material such as silicon oxide or silicon nitride.

The display unit may further include other components according to necessity. For example, as shown in FIG. 1, a thin film transistor (TFT) or a capacitor (Cap) may be formed on the substrate 100. The display unit may also include a buffer layer 110 that prevents impurities from penetrating into a semiconductor layer of the TFT, a gate insulating layer 130 that insulates the semiconductor layer of the TFT from a gate electrode, an interlayer insulating layer 150 that insulates source/drain electrodes of the TFT from the gate electrode, a planarization layer 170 that covers the TFT and has a flat upper surface, or the like.

Although not illustrated in FIG. 1, an intermediate layer is disposed above the pixel electrodes 210. The intermediate layer may have a multilayer structure including an emission layer. In this case, some portions of the intermediate layer may be a common layer that substantially corresponds to an entire surface of the substrate 100, and other portions of the intermediate layer may be a pattern layer that is patterned to correspond to the pixel electrodes 210. The intermediate layer may be formed of a low molecular weight material or a polymer material and may include a hole injection layer, a hole transport layer, the emission layer, an electron transport layer, an electron injection layer, and/or others. The intermediate layer may be formed by various methods such as a deposition method, a spin coating method, an inkjet print method, a laser thermal printing method, and/or others.

An opposite electrode that substantially corresponds to the entire surface of the substrate 100 may be disposed on the intermediate layer. The opposite electrode may cover the pixel-defining layer 180 as well as the spacers 182. In this case, the opposite electrode is formed on a curved surface of the pixel-defining layer 180 and the spacers 182, and thus, portions of the opposite electrode, which correspond to the spacers 182, may protrude the most toward the opposite substrate 300.

The opposite electrode may be a transparent (translucent) electrode or a reflective electrode. When the opposite electrode is a transparent (translucent) electrode, the opposite electrode may include a layer formed of metals having a small work function, that is, lithium (Li), calcium (Ca), lithium fluoride (LiF)/Ca, LiF/Al, Al, Ag, Mg, or combinations thereof, and a transparent (translucent) layer formed of ITO, IZO, ZnO, $In_2O_3$, etc. A structure and materials of the opposite electrode are not limited thereto and may vary.

The electronic component 400 may be a battery or a printed circuit board (PCB). The electronic component 400 may provide power to the display unit or may process electrical signals received/transmitted from/to the display unit. In embodiments, the electronic component may be more rigid than the substrate and the cover plate. The electronic component 400 is arranged on the other surface of the substrate 100 (a negative Z direction), and has a surface substantially parallel to the substrate 100 and having a polygonal shape. The polygonal shape may be a rectangular shape or square. FIG. 1 shows that the electronic component 400 adheres to the substrate 100, but the present embodiment is not limited thereto. For example, the electronic component 400 and the substrate 100 may have a space or other components therebetween.

In the portable electronic apparatus, the spacers 182, the pixel electrodes 210, and the electronic component 400 have a predetermined relationship. In particular, a location relationship between the spacers 182 and the pixel electrodes 210 may be determined in order not to make imaginary straight lines La and Lb, which pass the spacers 182 and are generally parallel to sides 400a and 400b having the polygonal shape of the surface the electronic component 400 pass portions of the pixel electrodes 210, which are exposed by the pixel-defining layer 180.

FIG. 2 shows that the sides 400a and 400b having the polygonal shape of the surface of the electronic component 400 are parallel to edges 100a and 100b of the substrate 100, wherein the surface is substantially parallel to the substrate 100. In this case, when the sides 400a and 400b having the polygonal shape of the surface of the electronic component 400 which is substantially parallel to the substrate 100 are considered, the straight lines La and Lb, which are substantially parallel to the sides 400a and 400b having the polygonal shape and pass the spacers 182, do not pass the portions of the pixel electrodes 210 which are exposed by the pixel-defining layer 180, as shown in FIG. 2. When the sides 400a and 400b having the polygonal shape of the surface of the electronic component 400, which is substantially parallel to the substrate 100, are substantially parallel to the edges 100a and 100b of the substrate 100, the spacers 182 may be disposed between the pixel electrodes 210 that are adjacent to each other in a diagonal direction, not in upward and downward directions or left and right directions. In this case, each of the portions of the pixel electrodes 210 which is exposed by the pixel-defining layer 180 has a major axis in a Y direction and a minor axis in an X direction, and the major and minor axes may be substantially parallel to the sides 400a and 400b having the polygonal shape.

When impact is applied to the portable electronic apparatus while manufacturing or using the portable electronic apparatus after the manufacture, the substrate 100 and the opposite substrate 300 may be (at least slightly) bent. In this regard, a degree of bending the substrate 100 by the electronic component 400, which is disposed on the other surface of the substrate 100 (a negative Z direction), may be different from a degree of bending the opposite substrate 300. Accordingly, a slip may be generated between the substrate 100 and the opposite substrate 300. Especially, a degree of the slip may be greatest at an edge of the electronic component 400. For example, bending degrees of the substrate 100 and the opposite substrate 300 are extremely small on portions of the substrate 100 and the opposite substrate 300 which correspond to the electronic component 400. The bending degrees of the substrate 100 and the opposite substrate 300 are substantially the same on portions of the substrate 100 and the opposite substrate 300 which do not correspond to the electronic component 400.

However, the substrate 100 may be bent around the edge of the electronic component 400 relatively greater than the opposite substrate 300 because of an effect provided by the electronic component 400. Therefore, when external impact, etc., are provided to the portable electronic apparatus, a slip may be generated between the substrate 100 and the opposite substrate 300 around or in proximity to the edge of the electronic component 400. Since the slip is temporarily generated by the external impact, the location relationship between the substrate 100 and the opposite substrate 300 may be restored to be the same as when the external impact is not applied, after the external impact is removed. However, the display unit between the substrate 100 and the opposite substrate 300 may have defects or marks because the slip is generated.

In particular, when the slip is generated between the substrate 100 and the opposite substrate 300, the opposite substrate 300 may contact a structure disposed on the substrate 100 due to the external impact. That is, the opposite substrate 300 may contact parts of the opposite electrode disposed on the spacers 182, and in this case, a material disposed on the opposite electrode may be transferred to the opposite substrate 300. For example, portions of a capping layer, which is an organic material disposed on the opposite electrode in order to prevent damage to the opposite electrode, may be transferred to the opposite substrate 300.

Since the portions of a capping layer that is an organic material disposed on the opposite electrode are transferred to the opposite substrate 300 when the slip is generated between the substrate 100 and the opposite substrate 300, a location of the transferred material in a state where the location relationship between the substrate 100 and the opposite substrate 300 is restored does not correspond to the locations of the spacers 182 disposed on the substrate 100. Therefore, in a case where at least one portion of the location of the transferred material overlaps the portions of the pixel electrodes 210 which are exposed by the pixel-defining layer 180, the emission of light emitted from the intermediate layer disposed on the pixel electrodes 210 may be affected, and thus, a high-quality image is not displayed. However, the portable electronic apparatus according to one or more embodiments of the present invention may effectively prevent the location of the touch mark of the transferred material from overlapping the portions of the pixel electrodes 210 which are exposed by the pixel-defining layer 180 when viewed in a viewing direction perpendicular to the surface of the substrate.

As described above, the slip generated between the substrate 100 and the opposite substrate 300 is affected mainly by the electronic component 400, and thus, a direction of the slip generated between the substrate 100 and the opposite substrate 300 is also affected mainly by the electronic component 400. In particular, the slip between the substrate 100 and the opposite substrate 300 may be generated in a direction perpendicular to the sides 400a and 400b having the polygonal shape of the surface of the electronic component 400 which is substantially parallel to the substrate 100. Referring to FIG. 2, the opposite substrate 300 may slip in a positive or negative Y direction that is perpendicular to the side 400a with respect to the substrate 100 due to the external impact, or may slip in a positive or negative X direction that is perpendicular to the side 400b.

If a material is transferred to the opposite substrate 300 when the opposite substrate 300 slips in a positive or negative Y direction that is perpendicular to the side 400a with respect to the substrate 100 or in a positive or negative X direction that is perpendicular to the side 400b with respect to the substrate 100, and then the opposite substrate 300 returns to an original location thereof with respect to the substrate 100, the transferred material becomes to be located on the straight lines La and Lb that pass the spacers 182 and are substantially parallel to the sides 400a and 400b having the polygonal shape of the surface of the electronic component 400, wherein the surface is generally parallel to the substrate 100. As described above, in the portable electronic apparatus according to one or more embodiments of the present invention, the location relationship between the spacers 182 and the pixel electrodes 210 is determined in order not to make the straight lines La and Lb, which pass the spacers 182 and are substantially parallel to the sides 400a and 400b having the polygonal shape of the surface, pass the portions of the pixel electrodes 210 which are exposed by the pixel-defining layer 180. Accordingly, the transferred material, which is disposed on the straight lines La and Lb that pass the spacers 182 and are substantially parallel to the sides 400a and 400b having the polygonal shape of the surface of the electronic component 400 which is substantially parallel to the substrate 100, does not overlap the portions of the pixel electrodes 210 which are exposed by the pixel-defining layer 180, and thus, a portable electronic apparatus capable of displaying a high-quality image despite of the external impact may be implemented.

A case where the material that is transferred to the opposite substrate 300 is a capping layer is described. However, the present invention is not limited thereto, and the material that is transferred to the opposite substrate 300 may be, for example, portions of the opposite electrode or portions of the opposite electrode and the intermediate layer. In a case where the transferred material is a portion of a component, a portable electronic apparatus capable of displaying a high-quality image despite of the external impact may be implemented, according to one or more embodiments of the present invention. Embodiments and modified embodiments to be described below may be the same as above.

A case where the spacers 182 are disposed on the pixel-defining layer 180 is described so far. In this case, the spacers 182 may be combined with the pixel-defining layer 180, i.e., the spacers 182 and the pixel-defining layer 180 may be formed integrally as a single body. However, the portable electronic apparatus is not limited thereto. For example, an upper surface of the pixel-defining layer 180 is covered with the opposite electrode, and the spacers 182 may be disposed on the opposite electrode to correspond to the pixel-defining layer 180 covered with the opposite electrode. As described above, a portable electronic apparatus capable of always displaying a high-quality image may be implemented by determining the location relationship between the portions of the pixel electrodes 210 that are exposed by the pixel-defining layer 180 and the spacers 182. Embodiments and modified embodiments to be described below may be the same as above.

Figure 3:
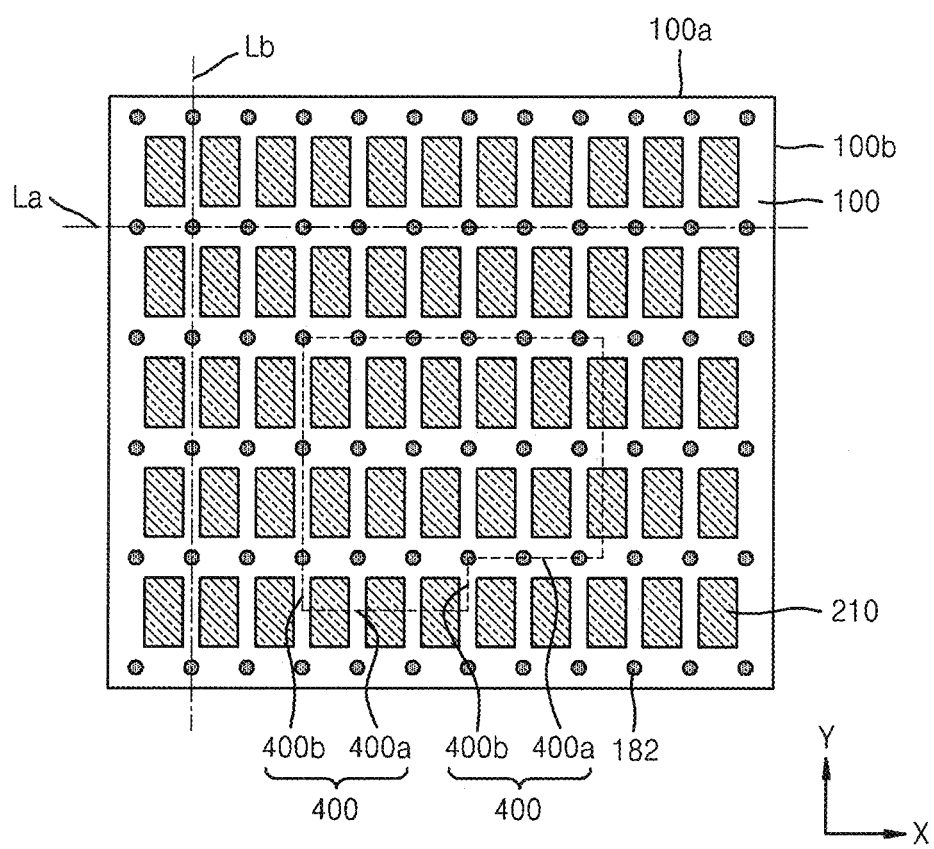
FIG. 3 is a plan view of a portion of the portable electronic apparatus according to another embodiment of the present invention.

In addition, the electronic component 400 is not limited to having a rectangular or square shape. For example, as shown in FIG. 3 that is a plan view of a portion of a portable electronic apparatus according to another embodiment of the present invention, the electronic component 400 may include a polygonal-shaped surface having three first sides 400a that are substantially parallel to each other and three second sides 400b that are perpendicular to the first sides 400a and substantially parallel to each other. Embodiments and modified embodiments to be described below may be the same as above.

Figure 4:
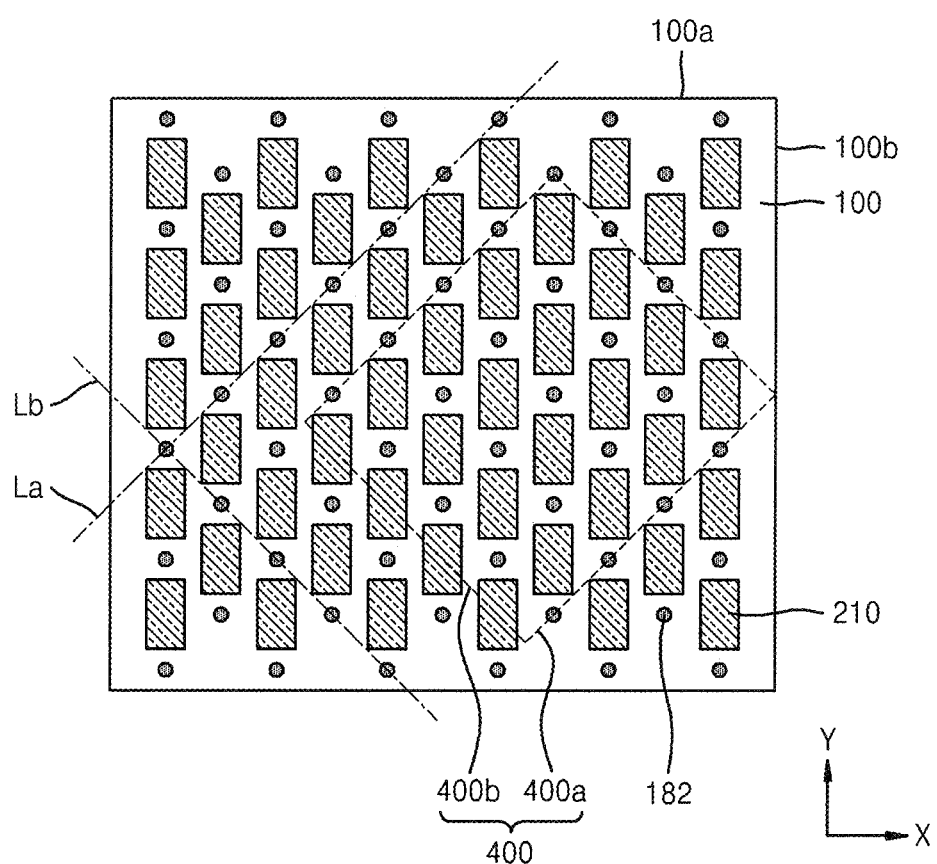
FIG. 4 is a plan view of a portion of the portable electronic apparatus according to another embodiment of the present invention.

FIG. 4 is a plan view of a portion of a portable electronic apparatus according to another embodiment of the present invention. In the portable electronic apparatus according to the present embodiment, the electronic component 400 is arranged so that the sides 400a and 400b having the polygonal shape of the surface of the electronic component 400 which is substantially parallel to the substrate 100, cross edges 100a and 100b of the substrate 100. In this case, each of the portions of the pixel electrodes 210 that are exposed by the pixel-defining layer 180 has a major axis in a Y direction and a minor axis in an X direction, and the major and minor axes may cross the sides 400a and 400b having the polygonal shape.

In the portable electronic apparatus according to the present embodiment, when the sides 400a and 400b having the polygonal shape of the surface of the electronic component 400 in a direction to the substrate 100 are considered, the straight lines La and Lb, which are substantially parallel to the sides 400a and 400b having the polygonal shape and pass the spacers 182 do not pass the portions of the pixel electrodes 210 that are exposed by the pixel-defining layer 180, as shown in FIG. 4. When the sides 400a and 400b having the polygonal shape of the surface of the electronic component 400 in a direction to the substrate 100 cross the edges 100a and 100b of the substrate 100, the spacers 182 may be disposed between the pixel electrodes 210 in the major-axis direction (a Y direction) and in the minor-axis direction (an X direction) of the portions of the pixel electrodes 210 that are exposed by the pixel-defining layer 180.

As described above, since the portions of the capping layer that are formed of an organic material are transferred to the opposite layer 300 when a slip is generated between the substrate 100 and the opposite substrate 300, a location of the transferred material in a state where the location relationship between the substrate 100 and the opposite substrate 300 is restored to its original relationship, does not correspond to the locations of the spacers 182 on the substrate 100. Therefore, when the location of the transferred material overlaps at least some of the portions of the pixel electrodes 210 that are exposed by the pixel-defining layer 180 when viewed in the viewing direction, the emission of light emitted to the outside from the intermediate layer disposed on the pixel electrodes 210 may be affected, and thus, a high-quality image is not displayed. However, the portable electronic apparatus according to the present embodiment may effectively prevent the location of the transferred material from overlapping the portions of the pixel electrodes 210 that are exposed by the pixel-defining layer 180.

As described above, the slip generated between the substrate 100 and the opposite substrate 300 is affected mainly by the electronic component 400, and thus, a direction of the slip generated between the substrate 100 and the opposite substrate 300 is also affected mainly by the electronic component 400. In particular, the slip may be generated between the substrate 100 and the opposite substrate 300 in a direction perpendicular to the sides 400a and 400b having the polygonal shape of the surface of the electronic component 400 in a direction to the substrate 100. In FIG. 4, the opposite substrate 300 slips relatively to the substrate 100 in a direction between a negative X direction and a positive Y direction, which is a direction perpendicular to the side 400a, or in a direction between a positive X direction and a positive Y direction which is perpendicular to the side 400b.

When the opposite substrate 300 returns to an original location thereof after the transferred material is transferred to the opposite substrate 300 that slips as described above, the transferred material is disposed on the straight lines La and Lb that pass the spacers 182 and are substantially parallel to the sides 400a and 400b having the polygonal shape of the surface of the electronic component 400 in a direction to the substrate 100. In the portable electronic apparatus according to the present embodiment, the location relationship between the spacers 182 and the pixel electrodes 210 is determined in order not to make the straight lines La and Lb, which pass the spacers 182 and are substantially parallel to the sides 400a and 400b, pass the portions of the pixel electrodes 210 that are exposed by the pixel-defining layer 180. As a result, the transferred material that is disposed along the straight lines La and Lb, which pass the spacers 182 and are substantially parallel to the sides 400a and 400b having the polygonal shape of the surface of the electronic component 400 in a direction to the substrate 100 does not overlap the portions of the pixel electrodes 210 that are exposed by the pixel-defining layer 180 when viewed in the viewing direction, and thus, the portable electronic apparatus capable of displaying a high-quality image despite of the external impact may be implemented.

A case where the portions of the pixel electrodes 210 that are exposed by the pixel-defining layer 180 have major and minor axes is described, but the present invention is not limited thereto. For example, the portions of the pixel electrodes 210 that are exposed by the pixel-defining layer 180 may have a square shape, or other cases.

As described above, according to the one or more of the above embodiments of the present invention, a portable electronic apparatus capable of preventing the occurrence of defects in a display unit may be implemented. However, the scope of the invention is not limited thereto.

It should be understood that embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A portable electronic apparatus comprising:
   a substrate comprising a first surface and a second surface facing away from the first surface;
   a plurality of pixel electrodes arranged over the first surface of the substrate;
   a pixel-defining layer arranged over the first surface of the substrate such that at least a portion of each of the plurality of pixel electrodes is exposed;
   a plurality of protrusions formed over the pixel-defining layer; and
   an electronic component arranged over the second surface of the substrate, the electronic component having a polygonal shaped surface facing and substantially parallel to the second surface of the substrate,
   wherein, when viewed in a direction perpendicular to the second surface, imaginary straight lines that pass the plurality of protrusions are substantially parallel to at least one among sides of the polygonal shaped surface and do not pass the exposed portions of the plurality of pixel electrodes.

2. The portable electronic apparatus of claim 1, wherein the polygonal shaped surface has a rectangular shape or a square shape.

3. The portable electronic apparatus of claim 1, wherein the electronic component is a battery or a printed circuit board (PCB).

4. The portable electronic apparatus of claim 1, wherein the pixel-defining layer and the plurality of protrusions are integrally formed in a single body.

5. The portable electronic apparatus of claim 1, wherein the sides of the polygonal shaped surface are substantially parallel to edges of the substrate when viewed in the direction.

6. The portable electronic apparatus of claim 5, wherein each of the exposed portions of the plurality of pixel electrodes is surrounded by the pixel defining layer when viewed in the direction and has a major axis and a minor axis, and wherein the major and minor axes are substantially parallel to the sides of the polygonal shaped surface when viewed in the direction.

7. The portable electronic apparatus of claim 1, wherein the sides of the polygonal shaped surface cross edges of the substrate when viewed in the direction.

8. The portable electronic apparatus of claim 7, wherein each of the exposed portions of the plurality of pixel electrodes has a major axis and a minor axis, and the major and minor axes cross the sides of the polygonal shaped surface when viewed in the direction.

9. The portable electronic apparatus of claim 8, wherein the plurality of protrusions are disposed between the plurality of pixel electrodes in the major axis direction and the minor axis direction when viewed in the direction.

10. The portable electronic apparatus of claim 1, wherein the exposed portions of the plurality of pixel electrodes do not overlap the protrusions when viewed in the direction.

11. The portable electronic apparatus of claim 1, wherein the electronic component is more rigid than the substrate.

12. The portable electronic apparatus of claim 1, wherein the polygonal shaped surface is bonded directly on the second surface of the substrate using an adhesive.

13. The portable electronic apparatus of claim 1, wherein the imaginary straight lines are inclined with respect to edges of the substrate when viewed in the direction.

14. The portable electronic apparatus of claim 1, further comprising a cover plate disposed over the substrate, wherein the plurality of pixel electrodes, the pixel defining layer and the plurality of protrusions are disposed between the substrate and the cover plate, the plurality of protrusions protruding toward the cover plate.

15. The portable electronic apparatus of claim 14, wherein the cover plate is spaced from and does not contact the plurality of protrusions when external force is not applied.

16. The portable electronic apparatus of claim 14, wherein the electronic component is more rigid than the substrate and the cover plate.

\* \* \* \* \*